United States Patent [19]

Watanabe et al.

[11] Patent Number: 5,361,408
[45] Date of Patent: Nov. 1, 1994

[54] DIRECT CONVERSION RECEIVER ESPECIALLY SUITABLE FOR FREQUENCY SHIFT KEYING (FSK) MODULATED SIGNALS

[75] Inventors: Kazunori Watanabe; Yasumi Imagawa, both of Yokohama; Makoto Hasegawa, Tokyo; Kazuaki Takahashi, Kawasaki, all of Japan

[73] Assignee: Matsushita Electric Industrial Co., Ltd., Osaka, Japan

[21] Appl. No.: 734,447

[22] Filed: Jul. 23, 1991

[30] Foreign Application Priority Data

Jul. 30, 1990 [JP] Japan .................................. 2-202115

[51] Int. Cl.$^5$ ........................... H04B 1/16; H04B 1/00
[52] U.S. Cl. .................................. 455/324; 455/300; 455/317; 455/333
[58] Field of Search ................ 455/300, 303, 304, 310, 455/317, 318, 319, 323–325, 327, 333, 311; 329/301, 302; 375/88

[56] References Cited

U.S. PATENT DOCUMENTS

| | | | |
|---|---|---|---|
| 4,580,290 | 4/1986 | Ushida | 455/319 |
| 4,675,911 | 6/1987 | Sokolov et al. | 455/325 |
| 4,987,374 | 1/1991 | Burke | 329/302 |
| 5,060,298 | 10/1991 | Waugh et al. | 455/333 |
| 5,083,050 | 1/1992 | Vasile | 455/333 |

FOREIGN PATENT DOCUMENTS 1-317032  12/1989  Japan ................................ 455/319
2-170627  7/1990  Japan ............................. 455/150.1

OTHER PUBLICATIONS

Kohji Chiba et al., "Performance of Direct Conversion FSK Receiver," *Proceedings for Spring Cession of National Conference by the Electronic Information and Communication Engineers Society*, 1987, No. 2232, pp. 10–110.

Primary Examiner—Reinhard J. Eisenzopf
Assistant Examiner—Chi Pham
Attorney, Agent, or Firm—Mason, Fenwick & Lawrence

[57] ABSTRACT

A direct conversion receiver for providing a direct conversion of a radio frequency signal having a carrier frequency comprises a local oscillator for substantially equal frequency to the carrier, and a semiconductor integrated circuit mounting mixers and amplifiers for amplifying inputs to the mixer. The amplifiers amplify the local oscillation signals and/or radio frequency signal inputted from the outside of the semiconductor integrated circuit and supply the amplified signals to the mixers. The mixers mix these inputted signals and output the mixed signals to the outside of the semiconductor integrated circuit. By thus forming the receiver, radiation of the local oscillation signals to outside of the receiver and leakage inside thereof can be suppressed.

3 Claims, 2 Drawing Sheets

DIRECT CONVERSION RECEIVER ESPECIALLY SUITABLE FOR FREQUENCY SHIFT KEYING (FSK) MODULATED SIGNALS

BACKGROUND OF THE INVENTION

1. Field of the Invention

The present invention relates to a receiver, and more particularly to a direct conversion receiver used for various radio communication devices such as selective call receivers.

2. Description of the Related Art

A receiving system called to as direct conversion system in which a signal carried by a carrier frequency is directly frequency-converted into a baseband signal has recently been put to practical use in order to provide compact and low power consumption radio communication devices, particularly Frequency-Shift Keying (FSK) signal receivers. FIG. 3 shows an exemplary structure of such an FSK signal receiver using the direct conversion system (refer to, for example, Proceedings for Spring Cession of National Conference by the Electronic Information and Communication Engineers Society (Denshi Joho Tsushin Gakkai), No. 2232, 1987; Kohji CHIBA et al.: "Performance of Direct Conversion FSK Receiver"). In FIG. 3, a reference numeral 1 denotes an antenna; 2 a radio frequency amplifier; 3 and 4 mixers; 5 and 6 low pass filters; 7 and 8 amplitude limiting amplifiers, 9 a detector; 10 a phase shifter; and 11 an oscillator.

In operation of the above-mentioned FSK signal receiver, an FSK signal is received by the antenna 1. After the received signal is amplified by the radio frequency amplifier 2, it is distributed to the mixer 3 and 4. A local oscillation signal having a frequency which is substantially equal to the carrier frequency of the FSK signal is generated by the local oscillator 11 and then fed to the phase shifter 10. The phase of the local oscillation signal is shifted by 90° by the phase shifter 10 to generate two signals which are orthogonal in phase to each other for the mixers 3 and 4. The two orthogonal signals are mixed with the FSK signal by the mixers 3 and 4 to output I and Q signals, respectively, which are FSK demodulation signals with 90° out-of-phase to each other. After the I and Q signals are passed through the filters 5 and 6, respectively, they are amplified by the amplitude limiting amplifiers 7 and 8. The FSK signal is demodulated from the amplified I and Q signals by the detector 9.

In FIG. 4, a reference numeral 15 denotes a conventional orthogonal mixer unit including the mixers 3 and 4 and RF denotes a carrier signal. The mixer unit 15 is comprised of a semiconductor integrated circuit which is encircled by a dotted line. Reference numerals in FIG. 4 which are like to those in FIG. 1 denote like components. The orthogonal mixer unit 15 is adapted to receiver the carrier signal RF and the local oscillation signals, the phases of which have been shifted by the phase shifter 10, and to supply the I and Q signals.

The direct conversion system has a feature that the carrier frequency of the received FSK signal is substantially equal to the frequency of local oscillation signal. Accordingly, there is the possibility that a local oscillation signal radiated from one receiver is received by the other receiver having the same reception frequency located in the vicinity of the first receiver to mask a normal FSK signal. There is also the possibility that in case of pager and the like having a built-in receiving antenna, the local oscillation signal is leaked to the antenna to mask the normal FSK signal since the tuning frequency of the antenna is substantially equal to the frequency of the local oscillation signal. Radiation of the local oscillation signal from the mixer unit, the radio frequency amplifier and the antenna will interfere with the other receivers. If a FSK signal having a high input level is received by the antenna, the high level FSK signal will unwantedly reach at the oscillator through a path from an FSK signal input terminal of the mixer unit to an local oscillation signal input terminal, resulting in no oscillation of the oscillator.

Accordingly, an approach that an oscillator is implemented in an unit by being housed by, for example, a shield case has been adapted for the structure of the receiver in order to prevent the local oscillation signal from being leaked.

If a mixer unit is formed on a semiconductor integrated circuit in the direct conversion receiver having the structure as shown in FIGS. 3 and 4, the mixer unit includes, for example, a signal or double balanced mixer. The above-mentioned receiver usually requires the input level of the order from $-10$ to 0 dBm to the mixers 3 and 4 from the oscillator 11 to obtain necessary performances. It is necessary to input a high level local oscillation signal to a lead terminal of the semiconductor integrated circuit on which the mixer unit is provided. Therefore, in order to prevent the high level oscillation signal from being leaked, it is necessary to house not only the oscillator but also the lead terminals of the mixer unit in the shield case. In this way, prior art direct conversion receivers have problems that the packaging of the components in the receivers becomes complicated and that high and sophisticated technology to suppress the leakage of the local oscillation signal is needed.

SUMMARY OF THE INVENTION

The present invention aims at overcoming the foregoing problems. It is an object of the present invention to provide a direct conversion receiver which is capable of easily suppressing the leakage of a local oscillation signal even with a simple packaging structure of components.

In order to accomplish the above object, a direct conversion receiver of the present invention comprises a semiconductor integrated circuit which is provided with an amplification circuit for amplifying a local oscillation signal and a mixer circuit for mixing a carrier signal with the local oscillation signal.

Since the receiver of the present invention has an amplification circuit in the semiconductor integrated circuit, the level of the signal which is injected to a terminal of the semiconductor integrated circuit having the mixer unit from the oscillator can be lowered. A structure which is capable of reducing radiation of the local oscillation frequency signal to the outside of the receiver and leakage of the oscillation frequency signal inside of the receiver can be readily implemented.

DESCRIPTION OF THE PREFERRED EMBODIMENT

Figure 1:
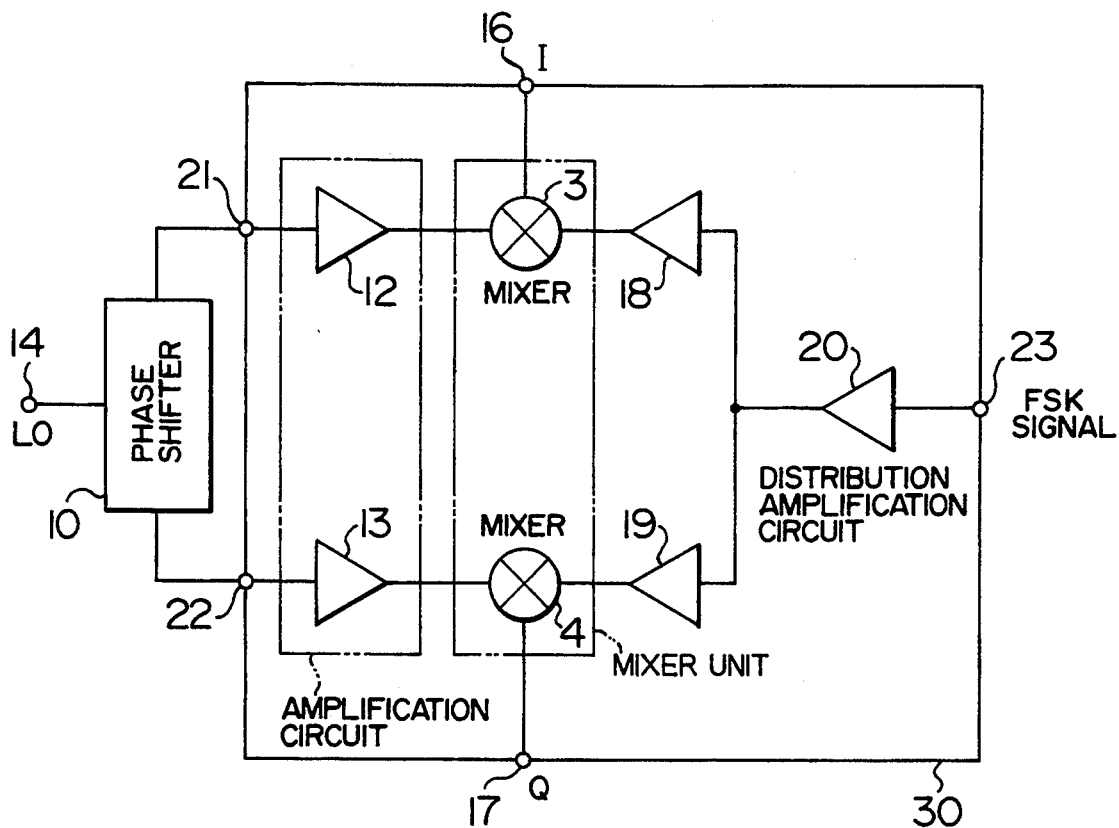
FIG. 1 is a block diagram showing one embodiment of an orthogonal mixer unit of a direct conversion receiver of the present invention.

A first embodiment of the present invention will be described with reference to FIG. 1 showing an orthogonal mixer unit of a receiver of the present invention mounted upon a semiconductor integrated circuit 30. In FIG. 1, reference numerals 3 and 4 denote mixers for mixing an FSK signal which is a radio frequency signal with a local oscillation signal (Lo); 12 and 13 amplification circuits for amplifying the local oscillation signal; 18 and 19 amplification circuits for amplifying the distributed FSK signals; 20 an amplification and distribution circuit for amplifying and distributing the FSK signal; 14 an input terminal for the local oscillation signal; 23 an input terminal for the FSK signal; and 16 and 17 output terminals for I and Q signals from the mixers.

In operation of the fore-going embodiment, the local oscillation signal (Lo) is converted into two signals with 90° out-of-phase to each other by the phase shifter 10. The phase shifted Lo signals are amplified by, for example, 10 dB by the amplification circuits 12 and 13, and then inputted to the mixers 3 and 4. On the other hand, an input signal to an FSK signal input terminal 23 is distributed into two signals by the amplification and distribution circuit 20, and the distributed two signals are amplified by the amplification circuits 18 and 19. The amplified FSK signals are mixed with the local oscillation signal Lo to provide FSK demodulation signals which are 90° out-of-phase. The FSK demodulation signals are then supplied to I and Q signal output terminals 16 and 17, respectively.

The local oscillation signals are amplified by, for example, 10 dB by the amplification circuits 12 and 13 and are inputted to the mixers 3 and 4 in this way in the fore-going embodiment. Accordingly, if input signals having −10 dBm are required for the mixers 3 and 4, it would suffice for the input signals to the lead terminals of the semiconductor integrated circuit, that is, input terminals of the amplification circuits 12 and 13 to be in the level of −20 dBm. If the packaging structure of the lead terminal of the semiconductor circuit 30 and the oscillator is identical with that of prior art, the amount of leaked local oscillation signal from the lead terminal can be thus effectively reduced by 10 dB. Therefore, the direct conversion receiver of the present invention has an advantage that a structure which is capable of reducing radiation of the local oscillation signal and leakage of the signal in the receiver can be easily realized. And an attenuation characteristics of the inverse transfer function of the amplifier located between the radio frequency amplifier and the mixers improves an attenuation characteristics of the inverse transfer function from the mixer unit to the antenna. Therefore, radiation of the local oscillation signal injected to the mixer unit to the outside of the receiver via the mixers, radio frequency amplification circuit and the antenna is reduced. Furthermore, the attenuation characteristics of the inverse transfer function from the mixers to the oscillator improved by that of the amplification circuit reduces leakage of the FSK signal to the oscillator.

Figure 2:
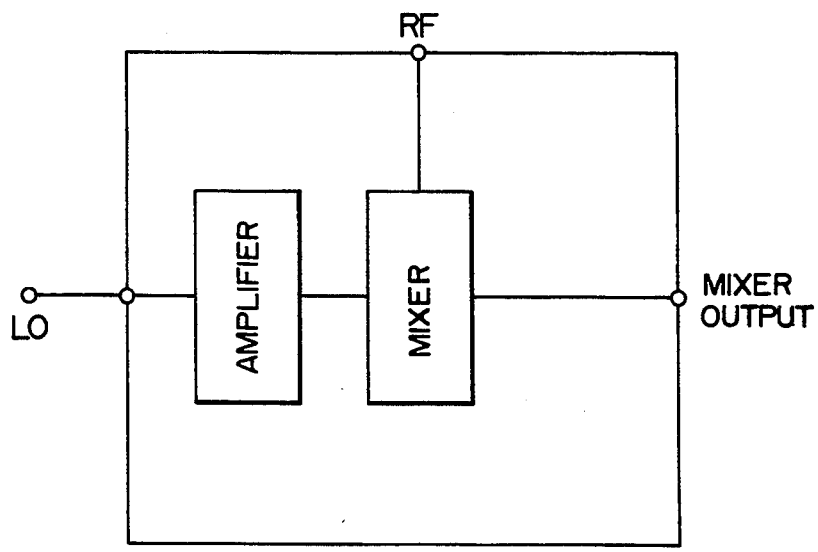
FIG. 2 is a block diagram showing a pair of a mixer and an amplifier.
Figure 3:
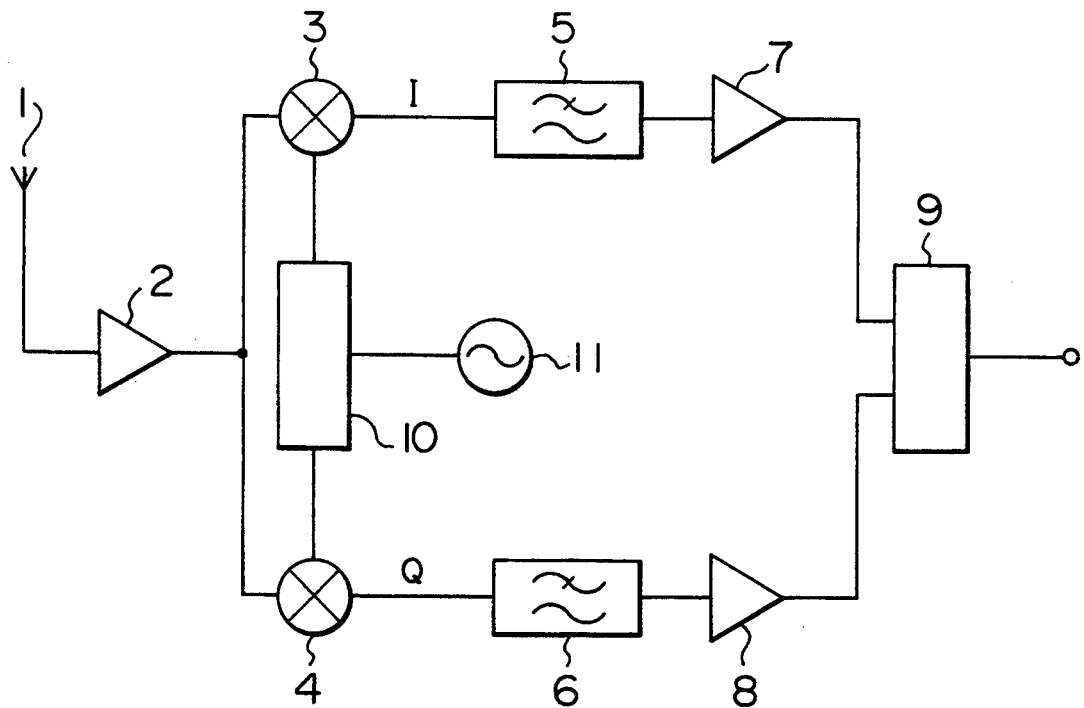
FIG. 3 is a block diagram showing the entire of prior art direct conversion receiver.
Figure 4:
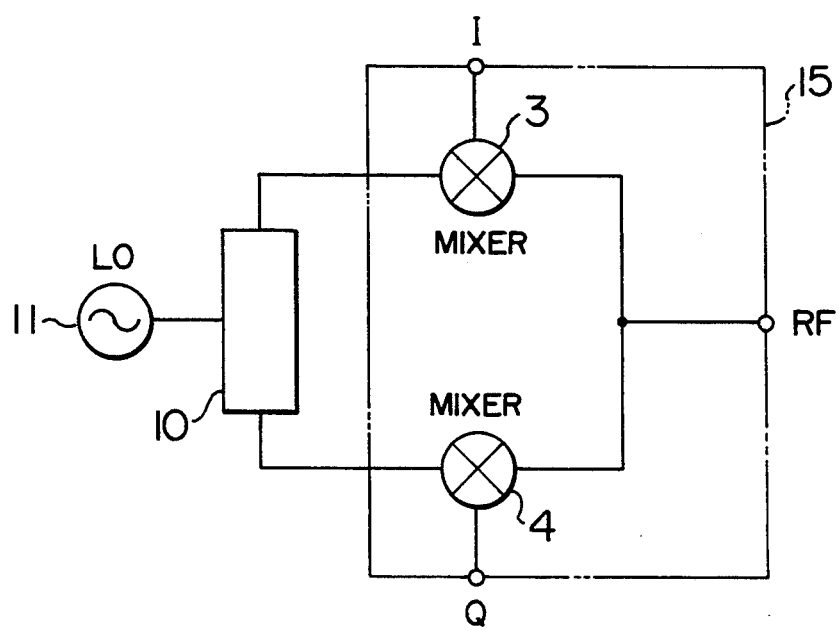
FIG. 4 is a block diagram showing an orthogonal mixer unit of the prior art receiver.

Referring now to FIG. 2, there is shown a block diagram explaining a pair of a mixer and an amplifier of the receiver of the present invention. The amplification circuit of FIG. 1 comprises a first 12 and a second 13 mixers inputting a first and a second local oscillation signals, respectively, and the mixer unit comprises a first 3 and a second 4 mixers. An output of the first amplifier 12 is inputted to the first mixer 3 and the distributed radio frequency signal is inputted thereto as a carrier input and they are mixed with each other by the first mixer 3 and is operated by a semiconductor integrated circuit and the operated signal is outputted to the outside through a mixer output terminal. A first pair of an amplifier and a mixer is provided in which an output of the first amplifier is inputted to the first mixer, and a second pair in which an output of the second amplifier is inputted to the second mixer. This more simplifies the semiconductor integrated circuit so that a low cost receiver can be provided.

The phase shifter 10 which is mounted in the outside of the semiconductor integrated circuit 30 in the foregoing embodiment can be formed of a network of capacitors and resistors which are built in a semiconductor integrated circuit. In this case, a more distinct effect of the present invention exhibits since a lead terminal for inputting a local oscillation signal is reduced.

Although the present invention has been described by way of an orthogonal mixer type direct conversion receiver used for FSK signal, it is not limited to the above-mentioned embodiment and may be applied to any system using a mixer circuit in which a carrier frequency is substantially equal to the local oscillation frequency.

The direct conversion receiver of the present invention can easily implement a structure which will reduce radiation of a local oscillation frequency signal to the outside of the receiver and leakage of the signal inside of the receiver.

The receiver of the present invention can reduce the amount of radiation of the local oscillation frequency signal injected to the mixer to the outside of the receiver through the mixer unit, the radio frequency amplifier circuit and the antenna and can reduce the amount of leakage of the radio frequency signals such as the FSK signal to the oscillator unit. Since the output of the oscillator unit may be in the low level, the oscillator unit can be made low power consuming and the packaging structure can be simplified. As a result of this, a compact and low power consumption receiver can be provided.

Since the physical dimension of the amplification circuit and the mixer and the length of leads for connecting them with each other can be made smaller in the semiconductor integrated circuit, the present invention has an effect that self-radiation and/or influence from the other circuits can be more remarkably reduced in comparison with a case in which these circuits are made of discrete circuits.

We claim:

1. A direct conversion receiver especially suitable for providing direct conversion of an input FSK-modulated radio--frequency signal of a predetermined carrier frequency, and for separating the input radio-frequency signal into two signals by using signals with a phase difference of $\pi/2$ of the carrier frequency, the direct conversion receiver comprising:

a) local oscillator means for generating a local oscillation signal having a frequency substantially equal to the carrier frequency and a magnitude small enough not to cause substantial electromagnetic interference with adjacent receivers; and b) a semiconductor integrated circuit including:
   1) amplification circuit means for amplifying the small-magnitude local oscillation signal provided through at least one lead from outside the semiconductor integrated circuit, and for providing an amplified oscillation signal; and
   2) mixer unit means for mixing (i) the amplified oscillation signal and (ii) a radio frequency signal corresponding to the input radio-frequency signal, and for outputting from the semiconductor integrated circuit an integrated circuit mixed output signal;

wherein the amplification circuit means within the semiconductor integrated circuit allows the local oscillation signal to be small enough so as not to cause substantial electromagnetic interference with the adjacent receivers, without the necessity of providing substantial additional shielding for the local oscillator means or the at least one lead.

2. The receiver of claim 1, wherein:
a) the receiver further comprises:
   1) a phase shifter for shifting a phase of the local oscillation signal so as to generate first and second local oscillation signals having orthogonal phases; and
   2) signal distributing means for distributing the input radio-frequency signal and for outputting first and second distributed radio-frequency signals;
b) the amplification circuit means includes first and second amplifiers respectively receiving the first and second local oscillation signals and providing respective first and second amplifier output signals; and
c) the mixer unit means includes first and second mixers which respectively receive the first and second amplifier output signals, and which also respectively receive the first and second distributed radio frequency signals, the first mixer mixing the first amplifier output signal and the first distributed radio frequency signal, the second mixer mixing the second amplifier output signal and the second distributed radio frequency signal, the first and second mixers outputting from the semiconductor integrated circuit first and second mixed signals included in the integrated circuit mixed output signal.

3. The receiver of claim 2, wherein the signal distributing means includes, within the semiconductor integrated circuit:
a) a distribution amplifier, responsive to the radio-frequency input signal, for providing a distribution amplifier output signal; and
b) third and fourth amplifiers for amplifying the distribution amplifier output signal, and for respectively providing the first and second distributed radio-frequency signals.

* * * * *